United States Patent
Motonari et al.

(10) Patent No.: US 8,741,008 B2
(45) Date of Patent: Jun. 3, 2014

(54) AQUEOUS DISPERSION FOR CHEMICAL MECHANICAL POLISHING AND CHEMICAL MECHANICAL POLISHING METHOD

(75) Inventors: Masayuki Motonari, Yokkaichi (JP); Eiichirou Kunitani, Kodaira (JP); Tomikazu Ueno, Yokkaichi (JP); Takahiro Iijima, Yokkaichi (JP); Takashi Matsuda, Yokkaichi (JP)

(73) Assignee: JSR Corporation, Tokyo (JP)

( * ) Notice: Subject to any disclaimer, the term of this patent is extended or adjusted under 35 U.S.C. 154(b) by 639 days.

(21) Appl. No.: 12/867,954

(22) PCT Filed: Dec. 18, 2008

(86) PCT No.: PCT/JP2008/073082
§ 371 (c)(1),
(2), (4) Date: Nov. 3, 2010

(87) PCT Pub. No.: WO2009/104334
PCT Pub. Date: Aug. 27, 2009

(65) Prior Publication Data
US 2011/0059680 A1    Mar. 10, 2011

(30) Foreign Application Priority Data

Feb. 18, 2008 (JP) ................................. 2008-035507
Jun. 3, 2008 (JP) ................................. 2008-145787

(51) Int. Cl.
*C09K 3/14* (2006.01)
(52) U.S. Cl.
USPC .............................. 51/300; 451/36; 252/79.1
(58) Field of Classification Search
None
See application file for complete search history.

(56) References Cited

U.S. PATENT DOCUMENTS

| | | | |
|---|---|---|---|
| 6,375,545 B1 * | 4/2002 | Yano et al. | 451/36 |
| 6,821,897 B2 * | 11/2004 | Schroeder et al. | 438/691 |
| 6,896,825 B1 | 5/2005 | Uchida et al. | |
| 6,899,821 B2 | 5/2005 | Uchida et al. | |
| 7,186,448 B2 * | 3/2007 | Yokoyama et al. | 428/1.5 |
| 7,560,384 B2 | 7/2009 | Shida et al. | |
| 2002/0193451 A1 * | 12/2002 | Motonari et al. | 516/9 |
| 2003/0124959 A1 | 7/2003 | Schroeder et al. | |
| 2003/0228762 A1 * | 12/2003 | Moeggenborg et al. | 438/691 |
| 2004/0055223 A1 | 3/2004 | Ono et al. | |
| 2004/0224616 A1 * | 11/2004 | Shiho et al. | 451/41 |
| 2004/0244300 A1 | 12/2004 | Ichiki et al. | |
| 2005/0095860 A1 | 5/2005 | Uchida et al. | |

(Continued)

FOREIGN PATENT DOCUMENTS

| | | |
|---|---|---|
| JP | 3337464 | 8/2002 |
| JP | 2005 014206 | 1/2005 |

(Continued)

OTHER PUBLICATIONS

Textbook entitled "Polymerization", Sec. R7.1, pp. 354-383; http://www.umich.edu/~elements/07chap/html/polymerization.pdf.*

(Continued)

*Primary Examiner* — Kaj K Olsen
*Assistant Examiner* — Ross J Christie
(74) *Attorney, Agent, or Firm* — Oblon, Spivak, McClelland, Maier & Neustadt, L.L.P.

(57) ABSTRACT

A chemical mechanical polishing aqueous dispersion includes (A) a graft polymer that includes an anionic functional group in a trunk polymer, and (B) abrasive grains.

10 Claims, 1 Drawing Sheet

(56) References Cited

U.S. PATENT DOCUMENTS

| | | |
|---|---|---|
| 2005/0150598 A1* | 7/2005 | Moeggenborg et al. .. 156/345.12 |
| 2006/0030670 A1* | 2/2006 | Lee et al. ............... 525/242 |
| 2006/0141741 A1 | 6/2006 | Yi et al. |
| 2006/0148391 A1 | 7/2006 | Ono et al. |
| 2006/0148392 A1 | 7/2006 | Ono et al. |
| 2006/0148393 A1 | 7/2006 | Ono et al. |
| 2006/0201914 A1 | 9/2006 | Uchikura et al. |
| 2006/0234901 A1* | 10/2006 | Scheuing et al. ......... 510/475 |
| 2006/0275939 A1* | 12/2006 | Yokoyama et al. ........ 438/48 |
| 2006/0276041 A1 | 12/2006 | Uchikura et al. |
| 2007/0104951 A1* | 5/2007 | Ito ....................... 428/402.2 |
| 2007/0128874 A1 | 6/2007 | Shida et al. |
| 2008/0318427 A1 | 12/2008 | Kunitani et al. |
| 2009/0124172 A1 | 5/2009 | Uchikura et al. |
| 2009/0165395 A1 | 7/2009 | Ikeda et al. |
| 2009/0181540 A1 | 7/2009 | Shida et al. |
| 2009/0221213 A1 | 9/2009 | Namie et al. |
| 2009/0239373 A1 | 9/2009 | Shida et al. |
| 2009/0267020 A1* | 10/2009 | Lee et al. ............... 252/79.1 |
| 2009/0291620 A1 | 11/2009 | Kunitani et al. |
| 2009/0302266 A1 | 12/2009 | Takemura et al. |
| 2009/0325383 A1 | 12/2009 | Andou et al. |
| 2010/0075501 A1 | 3/2010 | Abe et al. |
| 2010/0099260 A1 | 4/2010 | Matsumoto et al. |
| 2010/0221918 A1 | 9/2010 | Takemura et al. |
| 2011/0250756 A1 | 10/2011 | Uchikura et al. |

FOREIGN PATENT DOCUMENTS

| | | |
|---|---|---|
| JP | 2005 129637 | 5/2005 |
| JP | 2005 513765 | 5/2005 |
| WO | 02 43921 | 6/2002 |
| WO | 2006 071063 | 7/2006 |

OTHER PUBLICATIONS

International Search Report issued Feb. 24, 2009 in PCT/JP08/73082 filed Dec. 18, 2002.
U.S. Appl. No. 12/749,934, filed Mar. 30, 2010, Shida, et al.
U.S. Appl. No. 12/866,571, filed Aug. 6, 2010, Shida, et al.
U.S. Appl. No. 12/918,013, filed Aug. 17, 2010, Shida, et al.
U.S. Appl. No. 12/919,897, filed Aug. 27, 2010, Nishimoto, et al.

* cited by examiner

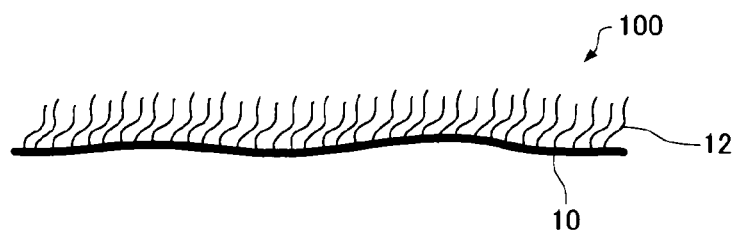

AQUEOUS DISPERSION FOR CHEMICAL MECHANICAL POLISHING AND CHEMICAL MECHANICAL POLISHING METHOD

TECHNICAL FIELD

The present invention relates to a chemical mechanical polishing aqueous dispersion and a chemical mechanical polishing method.

BACKGROUND ART

A copper damascene interconnect provided in a high-performance LSI is formed by chemical mechanical polishing (hereinafter may be referred to as "CMP"). CMP includes a first polishing step that mainly polishes copper, and a second polishing step that polishes unnecessary metal, a barrier metal film, and an insulating film. The first polishing step is required to polish the copper film at a high speed and suppress copper dishing without substantially polishing the barrier metal film formed of tantalum, titanium, ruthenium, cobalt, a nitride thereof, or the like. The second polishing step is required to form a flat polished surface by controlling the polishing rate ratio of the copper interconnect, the barrier metal film, and the insulating film within a given range.

In recent years, a porous low-dielectric-constant insulating film having a dielectric constant (k) of less than 2.5 has been studied instead of a p-TEOS film, etc. along with scaling down of semiconductor devices. Such a low-dielectric-constant insulating film has low mechanical strength, and is likely to absorb a polishing slurry due to porosity. Therefore, the electrical properties of the low-dielectric-constant insulating film may deteriorate due to polishing. Accordingly, development of a novel chemical mechanical polishing slurry that ensures flatness and does not cause a deterioration in electrical properties of the low-dielectric-constant insulating film due to polishing has been desired.

For example, a polishing composition disclosed in Japanese Patent No. 3337464 that contains a polymer having an anionic functional group may not achieve flatness when used to polish a substrate that includes a porous low-dielectric-constant insulating film having a dielectric constant (k) of less than 2.5, since the low-dielectric-constant insulating film is polished at a high polishing rate. For example, when chemically and mechanically polishing a porous low-dielectric-constant insulating film having a dielectric constant (k) of less than 2.5 using a polishing composition disclosed in JP-A-2005-14206 that contains an anionic surfactant and a polyoxyalkylene alkyl ether nonionic surfactant or a polishing composition disclosed in JP-A-2005-129637 that contains a polyether-modified silicone, polishing defects (e.g., scratches) may occur in the low-dielectric-constant insulating film having low mechanical strength. Moreover, the hygroscopicity of the low-dielectric-constant insulating film may deteriorate due to polishing so that the electrical properties may deteriorate.

DISCLOSURE OF THE INVENTION

The invention is to provide a chemical mechanical polishing aqueous dispersion that can polish a metal film (e.g., copper), a barrier metal film (e.g., tantalum, titanium, ruthenium, cobalt, or a nitride thereof), and a low-dielectric-constant insulating film at a practical polishing rate without causing a deterioration in electrical properties (e.g., dielectric constant) of the low-dielectric-constant insulating film or surface defects of the polishing target surface, and a chemical mechanical polishing method using the same.

According to the invention, there is provided a chemical mechanical polishing aqueous dispersion comprising (A) a graft polymer that includes an anionic functional group in a trunk polymer, and (B) abrasive grains.

In the above chemical mechanical polishing aqueous dispersion, the graft polymer (A) may include a trunk polymer that includes a carboxyl group, and a branch polymer that is soluble in an organic solvent, two or more molecules of the branch polymer being grafted onto one molecule of the trunk polymer.

In the above chemical mechanical polishing aqueous dispersion, the graft polymer (A) may include a repeating unit shown by the following formula (1),

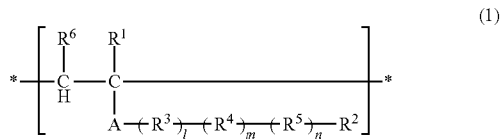

(1)

wherein $R^1$ represents a hydrogen atom or a substituted or unsubstituted alkyl group having 1 to 6 carbon atoms, $R^2$ represents a hydrogen atom or a substituted or unsubstituted alkyl group having 1 to 12 carbon atoms, A represents a single bond, —O—, —COO—, an oxyalkylene group having 1 to 9 carbon atoms (—$C_qH_{2q}$O— (wherein q represents an arbitrary integer from 1 to 9)), or an amide group (—CONH—), $R^3$, $R^4$, and $R^5$ individually represent a structural unit selected from —$C_2H_4$O—, —$C_3H_6$O—, and —$C_4H_8$O—, l, m, and n individually represent an arbitrary integer from 0 to 100, provided that l+m+n>0 is satisfied, $R^6$ represents a hydrogen atom or a carboxyl group, and * represents a bonding hand.

In the above chemical mechanical polishing aqueous dispersion, the graft polymer (A) may include a repeating unit shown by the following formula (2),

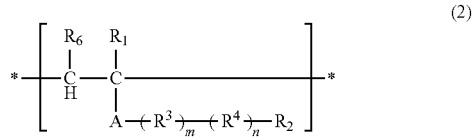

(2)

wherein $R^1$ represents a hydrogen atom or a substituted or unsubstituted alkyl group having 1 to 6 carbon atoms, $R^2$ represents a hydrogen atom or a substituted or unsubstituted alkyl group having 1 to 12 carbon atoms, A represents a single bond, —O—, —COO—, an oxyalkylene group having 1 to 9 carbon atoms (—$C_qH_{2q}$O— (wherein q represents an arbitrary integer from 1 to 9)), or —NH—, $R^3$ and $R^4$ individually represent a structural unit selected from —$C_2H_4$O—, —$C_3H_6$O—, and —$C_4H_8$O—, m and n individually represent an arbitrary integer from 0 to 100, provided that m+n>0 is satisfied, $R^6$ represents a hydrogen atom or a carboxyl group, and * represents a bonding hand.

In the above chemical mechanical polishing aqueous dispersion, the graft polymer (A) may have a weight average molecular weight of 50,000 to 800,000.

In the above chemical mechanical polishing aqueous dispersion, the content of the graft polymer (A) may be 0.001 to 1.0 mass %.

In the above chemical mechanical polishing aqueous dispersion, the abrasive grains (B) may be colloidal silica.

In the above chemical mechanical polishing aqueous dispersion, the ratio ((A):(B)) of the content of the graft polymer (A) to the content of the abrasive grains (B) may be 1:0.1 to 1:10,000.

According to the invention, there is provided a chemical mechanical polishing method comprising polishing a polishing target surface that includes at least a low-dielectric-constant insulating film using the above chemical mechanical polishing aqueous dispersion.

The above chemical mechanical polishing aqueous dispersion can polish a metal film (e.g., copper), a barrier metal film (e.g., tantalum, titanium, ruthenium, cobalt, or a nitride thereof), and a low-dielectric-constant insulating film at a practical polishing rate without causing a deterioration in electrical properties (e.g., dielectric constant) of the low-dielectric-constant insulating film or surface defects of the polishing target surface.

BRIEF DESCRIPTION OF THE DRAWINGS

FIG. 1 is a schematic diagram illustrating a graft polymer used in one embodiment that includes an anionic functional group.

BEST MODE FOR CARRYING OUT THE INVENTION

A chemical mechanical polishing aqueous dispersion according to the invention includes (A) a graft polymer that includes an anionic functional group in a trunk polymer, and (B) abrasive grains.

Preferred embodiments of the invention are described in detail below.

1. Chemical Mechanical Polishing Aqueous Dispersion

Each component of the chemical mechanical polishing aqueous dispersion according to one embodiment of the invention is described below.

1.1 Graft Polymer (A)

The graft polymer used in this embodiment includes an anionic functional group in a trunk polymer.

The graft polymer used in this embodiment preferably includes a trunk polymer that includes a carboxyl group, and a branch polymer that is soluble in an organic solvent, two or more molecules of the branch polymer being grafted onto one molecule of the trunk polymer.

FIG. 1 is a schematic diagram illustrating the graft polymer used in this embodiment that includes an anionic functional group. An anionic graft polymer 100 has a structure in which branch polymers 12 (i.e., graft chains) are grafted onto a trunk polymer 10 (i.e., main chain) that includes a plurality of acidic groups in the shape of a comb. The anionic graft polymer 100 adheres to the surface of a polishing target at a plurality of points (i.e., the acidic groups of the trunk polymer 10 are anchored on the surface of the polishing target). Therefore, the branch polymer 12 effectively exerts a three-dimensional repulsion effect so that excellent polishing performance can be achieved.

For example, the chemical mechanical polishing aqueous dispersion according to this embodiment exhibits excellent polishing performance when polishing a low-dielectric-constant insulating film. A low-dielectric-constant (Low-k) insulating film has a porous (air-containing) structure in order to implement a low dielectric constant. However, since a porous material has low strength due to a hollow structure, the polishing rate may increase to a large extent when polishing the porous material using a known chemical mechanical polishing aqueous dispersion. However, when the above graft polymer is present when polishing a low-dielectric-constant insulating film, the trunk polymer adheres to the polishing target surface of the low-dielectric-constant insulating film at a plurality of points, and the polishing rate of the low-dielectric-constant insulating film can be moderately reduced due to the three-dimensional repulsion effect of the branch polymer.

The term "low-dielectric-constant (Low-k) insulating film" refers to an insulating film that is formed of a material that preferably has a dielectric constant of 3.8 or less, more preferably 3.0 or less, and particularly preferably 2.5 or less. Examples of the low-dielectric-constant insulating film include insulating films formed of fluorine-containing $SiO_2$ (dielectric constant: about 3.3 to 3.5), a polyimide resin (dielectric constant: about 2.4 to 3.6; e.g., "PIQ" manufactured by Hitachi Chemical Co., Ltd., and "BCB" manufactured by AlliedSignal), hydrogen-containing SOG (dielectric constant: about 2.5 to 3.5), organic SOG (dielectric constant: about 2.9; e.g., "HSGR7" manufactured by Hitachi Chemical Co., Ltd.), an organic-inorganic hybrid porous material (dielectric constant: 2.0 or less), and the like.

A low-dielectric-constant insulating film formed by a nanoindentation method normally has a modulus of elasticity of about 20 GPa or less and a hardness of about 2.0 GPa or less. Specifically, since the modulus of elasticity of the low-dielectric-constant insulating film is significantly lower than that of a thermally oxidized $SiO_2$ film or a P-TEOS film (modulus of elasticity: about 70 GPa) (i.e., the low-dielectric-constant insulating film is very brittle), it is difficult to moderately reduce the polishing rate. For example, a non-porous MSQ low-dielectric-constant insulating film having a dielectric constant of about 2.8 has a modulus of elasticity of about 11 GPa and a hardness of about 1.5 GPa. A porous low-dielectric-constant insulating film having a dielectric constant of about 2.2 has a modulus of elasticity of about 3.2 GPa and a hardness of about 0.4 GPa.

The chemical mechanical polishing aqueous dispersion according to this embodiment may also be used to polish a copper interconnect film or a barrier metal film at a practical polishing rate in addition to the above low-dielectric-constant insulating film.

The trunk polymer 10 preferably includes a carboxyl group from the viewpoint of excellent adhesion. For example, the trunk polymer 10 may be a thermoplastic resin such as polyacrylic acid or a salt thereof, or polymethacrylic acid or a salt thereof. Among these, polyacrylic acid and polymethacrylic acid are preferable since the stability of the abrasive grains are not affected. It is particularly preferable to use polyacrylic acid due to high water solubility.

The trunk polymer 10 may be a copolymer of a monomer that includes a carboxyl group and other monomers. Examples of such other monomers include acrylic acid, methacrylic acid, alkyl acrylates (e.g., methyl acrylate and ethyl acrylate), alkyl methacrylates (e.g., methyl methacrylate and ethyl methacrylate), aminoalkyl acrylates (e.g., diethylaminoethyl acrylate), aminoalkyl methacrylates, a monoester of acrylic acid and a glycol, a monoester of methacrylic acid and a glycol (e.g., hydroxyethyl methacrylate), alkali metal salts of acrylic acid, alkali metal salts of methacrylic acid, vinyl methyl ether, vinyl ethyl ether, alkali metal salts of vinylsulfonic acid, an ammonium salt of vinylsulfonic acid, styrenesulfonic acid, styrenesulfonates, allylsulfonic acid, allylsulfonates, methallylsulfonic acid, methallylsulfonates, acrylamidealkylsulfonic acid, acrylamidealkylsulfonates, vinyl acetate, vinyl stearate, N-vinylimidazole, N-vinylacetamide, N-vinylformamide, N-vinylcaprolactam, N-vinylcarbazole, acrylamide, methacrylamide, N-alkylacrylamide, N-methylolacrylamide, N,N-methylenebisacrylamide, glycol diacrylate, glycol dimethacrylate, divinylbenzene, glycol diallyl ether, unsaturated alcohols (e.g., allyl alcohol), maleic anhydride, maleates, and the like.

The weight average molecular weight of the trunk polymer 10 is preferably 500 to 600,000, and more preferably 10,000 to 400,000. If the weight average molecular weight of the trunk polymer 10 is less than 500, the effect of providing the chemical mechanical polishing aqueous dispersion with viscosity may be small, so that the polishing rate may be improved to only a small extent. If the weight average molecular weight of the trunk polymer 10 is more than 600,000, the stability of the chemical mechanical polishing aqueous dispersion may deteriorate, or the viscosity of the aqueous dispersion may increase to a large extent, so that load may be imposed on a polishing liquid supply apparatus, for example.

It is preferable that the branch polymer 12 be soluble in an organic solvent in order to achieve an excellent three-dimensional repulsion effect. Note that the expression "soluble in an organic solvent" used herein means that a polymer having the same composition as that of the branch polymer can be dissolved in a normal organic solvent. Specific examples of such a polymer include a polymer that includes a hydroxyl group at the polymer end and forms a graft bond via an esterification reaction with the carboxyl group of the trunk polymer or an addition reaction with the hydroxyl group of the trunk polymer, such as a polymer that includes an oxyalkylene group (e.g., polyethylene glycol, polypropylene glycol, polybutylene glycol, polyoxyethylene alkyl ether, polyoxypropylene alkyl ether, polyoxyethylene alkenyl ether, and polyoxypropylene alkenyl ether), and a polymer that includes an amino group at the branch polymer end and forms a graft bond via an amidation reaction with the carboxyl group of the trunk polymer (e.g., polyoxyethylenealkylamine and polyoxypropylenealkylamine).

It is preferable that the graft polymer used in this embodiment include a repeating unit shown by the following formula (1).

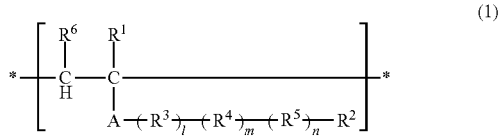

wherein $R^1$ represents a hydrogen atom or a substituted or unsubstituted alkyl group having 1 to 6 carbon atoms, $R^2$ represents a hydrogen atom or a substituted or unsubstituted alkyl group having 1 to 12 carbon atoms, A represents a single bond, —O—, —COO—, an oxyalkylene group having 1 to 9 carbon atoms (—$C_qH_{2q}$O— (wherein q represents an arbitrary integer from 1 to 9)), or an amide group (—CONH—), $R^3$, $R^4$, and $R^5$ individually represent a structural unit selected from —$C_2H_4$O—, —$C_3H_6$O—, and —$C_4H_8$O—, l, m, and n individually represent an arbitrary integer from 0 to 100, provided that l+m+n>0 is satisfied, $R^6$ represents a hydrogen atom or a carboxyl group, and * represents a bonding hand.

It is preferable that the graft polymer used in this embodiment further include a repeating unit shown by the following formula (3), (4), or (5). A polymer that includes the repeating unit shown by the formula (3), (4), or (5) may be a polymer in which the repeating unit shown by the formula (1) and the repeating unit shown by the formula (3), (4), or (5) are randomly bonded, or a block copolymer of the repeating unit shown by the formula (1) and the repeating unit shown by the formula (3), (4), or (5).

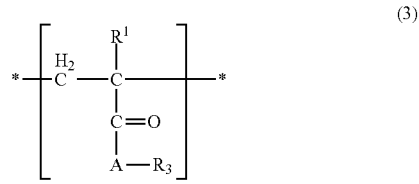

wherein $R^1$ represents a hydrogen atom or a substituted or unsubstituted alkyl group having 1 to 6 carbon atoms, $R^3$ represents a hydrogen atom or a substituted or unsubstituted alkyl group having 1 to 12 carbon atoms, A represents a single bond, —O—, or —NH—, and * represents a bonding hand.

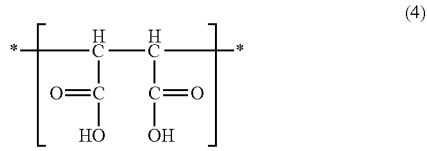

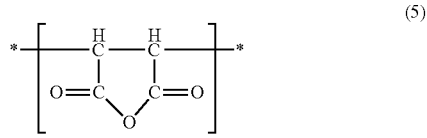

wherein * represents a bonding hand.

When the graft polymer includes the repeating unit shown by the formula (1) and the repeating unit shown by the formula (3), (4), or (5), a sufficient performance can be obtained when the ratio a/b of the number of moles "a" of the repeating unit shown by the formula (1) to the number of moles "b" of the repeating unit shown by the formula (3), (4), or (5) is 1/20 to 20/1. An excellent performance can be obtained when the ratio a/b is preferably 1/10 to 10/1, more preferably 1/1 to 3/1, and particularly preferably 1/1.

The content of the graft polymer used in this embodiment is preferably 0.001 to 1.0 mass %, more preferably 0.01 to 0.7 mass %, and particularly preferably 0.1 to 0.5 mass %, based on the mass of the chemical mechanical polishing aqueous dispersion. If the content of the graft polymer is less than 0.001 mass %, the polishing rate of a low-dielectric-constant insulating film may not be sufficiently reduced as compared with that of a metal film (e.g., copper) or a barrier metal film (e.g., tantalum, titanium, ruthenium, cobalt, or a nitride thereof). If the content of the graft polymer is more than 1.0 mass %, the abrasive grains may aggregate to impair the stability of the slurry.

The polystyrene-reduced weight average molecular weight of the graft polymer used in this embodiment determined by gel permeation chromatography (GPC) is preferably 2000 to 1,000,000, more preferably 5000 to 800,000, still more preferably 10,000 to 600,000, and particularly preferably 50,000 to 300,000. If the graft polymer has a weight average molecular weight within the above range, friction during polishing can be reduced, so that a metal film and an insulating film can be stably polished. If the graft polymer has a weight average molecular weight of 50,000 to 800,000, the number of scratches that occur on copper can be significantly reduced. If the weight average molecular weight of the graft polymer is lower than the above lower limit, the polishing rate of an insulating film may decrease (i.e., a sufficient polishing rate may not be achieved). If the weight average molecular weight of the graft polymer is higher than the above upper limit, the abrasive grains may aggregate to impair the stability of the slurry. Moreover, the abrasive grains may aggregate in a slurry supply apparatus, and may increase the number of scratches that occur on copper.

The ratio ((A):(B)) of the content of the graft polymer (A) to the content of the abrasive grains (B) is preferably 1:0.1 to 1:10,000, and more preferably 1:10 to 1:500. If the ratio ((A):(B)) of the content of the graft polymer (A) to the content of the abrasive grains (B) is within the above range, a polished surface having excellent flatness can be more reliably obtained while more reliably suppressing a deterioration in electrical properties.

1.2 Abrasive Grains (B)

The abrasive grains used in this embodiment are preferably at least one type of abrasive grains selected from inorganic particles, organic particles, and organic-inorganic composite particles.

Examples of the inorganic particles include fumed silica, fumed alumina, and fumed titania synthesized by reacting silicon chloride, aluminum chloride, titanium chloride, or the like with oxygen and hydrogen in a gas phase using a fuming method; silica synthesized by subjecting a metal alkoxide to hydrolysis and condensation using a sol-gel method; high-purity colloidal silica which is synthesized by an inorganic colloid method or the like and from which impurities have been removed by purification; and the like.

Examples of the organic particles include polyvinyl chloride, polystyrene, styrene copolymers, polyacetals, saturated polyesters, polyamides, polycarbonates, polyolefins and olefine copolymers (e.g., polyethylene, polypropylene, poly1-1-butene, and poly-4-methyl-1-pentene), phenoxy resins, (meth)acrylic resins and acrylic copolymers (e.g., polymethyl methacrylate), and the like.

The type, configuration, etc. of the organic-inorganic composite particles are not particularly limited insofar as organic particles and inorganic particles are integrally formed so that the organic particles and the inorganic particles are not easily separated during polishing. Examples of the organic-inorganic composite particles include composite particles obtained by subjecting an alkoxysilane, an aluminum alkoxide, a titanium alkoxide, or the like to polycondensation in the presence of polymer particles (e.g., polystyrene or polymethyl methacrylate) so that a polycondensate (e.g., polysiloxane, polyaluminoxane, or polytitanoxane) is formed on at least the surface of the polymer particles. The polycondensate may be directly bonded to a functional group of the polymer particle, or may be indirectly bonded to a functional group of the polymer particle through a silane coupling agent or the like.

The organic-inorganic composite particles may be formed using the above polymer particles and silica particles, alumina particles, titania particles, or the like. In this case, the composite particles may be formed so that silica particles or the like are present on the surface of the polymer particles using a polycondensate (e.g., polysiloxane, polyaluminoxane, or polytitanoxane) as a binder, or may be formed so that functional groups (e.g., hydroxyl groups) of silica particles or the like are chemically bonded to functional groups of the polymer particles.

The organic-inorganic composite particles may be composite particles in which organic particles and inorganic particles that differ in sign of the zeta potential are bonded due to an electrostatic force in an aqueous dispersion containing these particles.

The zeta potential of organic particles is normally negative over the entire pH range or a wide pH range excluding a low pH range. When organic particles have a carboxyl group, a sulfonic acid group, or the like, the organic particles more reliably have a negative zeta potential. When organic particles have an amino group or the like, the organic particles have a positive zeta potential in a given pH range.

The zeta potential of inorganic particles has high pH dependence. Inorganic particles have an isoelectric point at which the zeta potential becomes zero, and the sign of the zeta potential is reversed across the isoelectric point.

Therefore, when mixing given organic particles and inorganic particles in a pH range in which the organic particles and the inorganic particles differ in sign of the zeta potential, the organic particles and the inorganic particles are bonded due to an electrostatic force to form composite particles. Even if the organic particles and the inorganic particles have zeta potentials of the same sign when mixed, the organic particles and the inorganic particles may be bonded by reversing the sign of the zeta potential of either the organic particles or the inorganic particles (particularly the inorganic particles) by changing the pH of the mixture.

A polycondensate (e.g., polysiloxane, polyaluminoxane, or polytitanoxane) may be formed on at least the surface of the composite particles integrated due to an electrostatic force by subjecting an alkoxysilane, an aluminum alkoxide, a titanium alkoxide, or the like to polycondensation in the presence of the composite particles.

The average particle diameter of the abrasive grains is preferably 5 to 1000 nm. The average particle diameter of the abrasive grains may be measured using a laser scattering diffraction measuring instrument, or may be measured by observation using a transmission electron microscope. If the average particle diameter of the abrasive grains is less than 5 nm, a chemical mechanical polishing aqueous dispersion that achieves a sufficiently high polishing rate may not be obtained. If the average particle diameter of the abrasive grains is more than 1000 nm, dishing and erosion may not be sufficiently suppressed. Moreover, a stable aqueous dispersion may not be obtained due to precipitation/separation of the abrasive grains. The average particle diameter of the abrasive grains is more preferably 10 to 700 nm, and particularly preferably 15 to 500 nm. If the average particle diameter of the abrasive grains is within the above range, it is possible to obtain a stable chemical mechanical polishing aqueous dispersion that achieves a high polishing rate, sufficiently suppresses dishing and erosion, and rarely shows precipitation/separation of the abrasive grains.

The content of the abrasive grains is preferably 0.01 to 10 mass %, and more preferably 0.1 to 5 mass %, based on the mass of the chemical mechanical polishing aqueous dispersion. If the content of the abrasive grains is less than 0.01 mass %, a sufficient polishing rate may not be achieved. If the content of the abrasive grains is more than 10 mass %, an increase in cost may occur. Moreover, a stable chemical mechanical polishing aqueous dispersion may not be obtained.

1.3 Additives 1.3.1 Oxidizing Agent

The chemical mechanical polishing aqueous dispersion according to this embodiment may further include an oxidizing agent. Examples of the oxidizing agent include ammonium persulfate, potassium persulfate, hydrogen peroxide, ferric nitrate, cerium diammonium nitrate, iron sulfate, ozone, potassium periodate, peracetic acid, and the like. These oxidizing agents may be used either individually or in combination. Among these oxidizing agents, ammonium persulfate, potassium persulfate, and hydrogen peroxide are particularly preferable from the viewpoint of oxidizing power, compatibility with a protective film, handling capability, and the like. The content of the oxidizing agent is preferably 0.05 to 5 mass %, and more preferably 0.08 to 3 mass %, based on the mass of the chemical mechanical polishing aqueous dispersion. If the content of the oxidizing agent is less than 0.05 mass %, a sufficient polishing rate may not be achieved. If the content of the oxidizing agent is more than 5 mass %, corrosion or dishing of a metal film (e.g., Cu film) may occur to a large extent.

1.3.2 Organic Acid and Amino Acid

The chemical mechanical polishing aqueous dispersion according to this embodiment may further include an organic acid. Examples of the organic acid include formic acid, lactic acid, acetic acid, tartaric acid, fumaric acid, glycolic acid, phthalic acid, maleic acid, oxalic acid, citric acid, malic acid, anthranilic acid, malonic acid, glutaric acid, an organic acid that includes a heterocyclic six-membered ring that includes at least one N atom, and an organic acid that includes a heterocyclic compound that includes a heterocyclic five-membered ring. The organic acid is preferably quinaldic acid, quinolinic acid, 8-quinolinol, 8-aminoquinoline, quinoline-8-carboxylic acid, 2-pyridinecarboxylic acid, xanthurenic acid, kynurenic acid, benzotriazole, benzimidazole, 7-hydroxy-5-methyl-1,3,4-triazaindolizine, nicotinic acid, picolinic acid, and the like.

The chemical mechanical polishing aqueous dispersion according to this embodiment may further include an amino acid. Examples of the amino acid include glycine, alanine, phenylalanine, histidine, cysteine, methionine, glutamic acid, aspartic acid, tryptophan, and the like.

The content of the organic acid and/or the amino acid is preferably 0.001 to 2.0 mass %, and more preferably 0.01 to 1.5 mass %, based on the mass of the chemical mechanical polishing aqueous dispersion. If the content of the organic acid is less than 0.001 mass %, Cu dishing may occur to a large extent. If the content of the organic acid is more than 2.0 mass %, a stable chemical mechanical polishing aqueous dispersion may not be produced due to precipitation or separation of the abrasive grains.

1.3.3 Water-Soluble Polymer

The chemical mechanical polishing aqueous dispersion according to this embodiment may further include a water-soluble polymer differing from the graft polymer (A). Examples of the water-soluble polymer that may be used in this embodiment include polyacrylic acid, salts thereof, polymethacrylic acid, salts thereof, polyvinyl alcohol, polyethylene glycol, polyvinylpyrrolidone, and the like. The polyethylene glycol-reduced weight average molecular weight (Mw) of the water-soluble polymer determined by gel permeation chromatography (GPC) is more than 1000, preferably 10,000 to 2,000,000, more preferably 200,000 to 1,500,000, and particularly preferably 500,000 to 1,300,000. If the water-soluble polymer has a weight average molecular weight within the above range, defects (e.g., scratches) of a metal film can be suppressed while maintaining a high polishing rate for a metal film and an insulating film. If the weight average molecular weight of the water-soluble polymer is less than the above lower limit, a metal film or an insulating film may not be polished with high selectivity. If the weight average molecular weight of the water-soluble polymer is too high, a metal film may not be polished at a practical polishing rate. Moreover, the abrasive grains may aggregate in a slurry supply apparatus, and may increase the number of scratches that occur on copper.

1.3.4 Surfactant

The chemical mechanical polishing aqueous dispersion according to this embodiment may optionally include a nonionic surfactant, an anionic surfactant, or a cationic surfactant. Examples of the nonionic surfactant include a polyethylene glycol-type nonionic surfactant, a nonionic surfactant having a triple bond, and the like. Examples of the polyethylene glycol-type nonionic surfactant include polyoxyethylene alkyl ethers, polyoxypropylene alkyl ethers, polyoxyalkylene alkyl ethers, and the like. Examples of the nonionic surfactant having a triple bond include acetylene glycol, an acetylene glycol ethylene oxide adduct, acetylene alcohol, and the like. Further examples of the nonionic surfactant include a silicone surfactant, polyvinyl alcohol, cyclodextrin, polyvinyl methyl ether, hydroxyethylcellulose, and the like. Examples of the anionic surfactant include an aliphatic soap, sulfate salts, phosphate salts, and the like. Examples of the cationic surfactant include an aliphatic amine salt, an aliphatic ammonium salt, and the like. These surfactants may be used either individually or in combination.

The content of the surfactant is preferably 0.001 to 1 mass %, and more preferably 0.005 to 0.5 mass %, based on the mass of the chemical mechanical polishing aqueous dispersion. If the content of the surfactant is within the above range, friction applied to a metal film and an insulating film during polishing can be reduced.

1.4 Properties of Chemical Mechanical Polishing Aqueous Dispersion

The chemical mechanical polishing aqueous dispersion according to this embodiment is an aqueous dispersion in which the above components are dissolved or dispersed in water, and preferably has a viscosity of less than 10 mPa·s. The viscosity of the chemical mechanical polishing aqueous dispersion may be adjusted by controlling the average molecular weight and the content of the water-soluble polymer. If the viscosity of the chemical mechanical polishing aqueous dispersion is outside the above range, the slurry may not be stably supplied to abrasive cloth. As result, an increase in the temperature of the abrasive cloth, polishing non-uniformity (deterioration in in-plane uniformity), and the like may occur, so that a metal film and an insulating film may not be polished at a constant polishing rate, or Cu dishing may vary.

The pH of the chemical mechanical polishing aqueous dispersion may be appropriately adjusted depending on the properties of the low-dielectric-constant insulating film. For example, when the low-dielectric-constant insulating film is a porous film having a dielectric constant of 2.0 to 2.5, the pH of the chemical mechanical polishing aqueous dispersion is preferably 7 to 11, and more preferably 8 to 10. The pH of the chemical mechanical polishing aqueous dispersion may be adjusted to the alkaline region by adding a pH adjusting agent such as a basic salt (e.g., potassium hydroxide, ammonia, ethylenediamine, or tetramethylammonium hydroxide (TMAH)).

2. Chemical Mechanical Polishing Aqueous Dispersion Preparation Kit

A chemical mechanical polishing aqueous dispersion may be prepared by adding the graft polymer (A), the abrasive grains (B), and the additives to water, and may be directly used for chemical mechanical polishing. Alternatively, a chemical mechanical polishing aqueous dispersion that contains each component at a high concentration (i.e., concentrated aqueous dispersion) may be prepared. The concentrated aqueous dispersion may be diluted to a desired concentration before use, and used for chemical mechanical polishing.

Alternatively, a plurality of liquids (e.g., two or three liquids) that respectively contain one of the above components may be prepared, and mixed before use. In this case, a chemical mechanical polishing aqueous dispersion may be prepared by mixing the plurality of liquids, and supplied to a chemical mechanical polishing apparatus. Alternatively, the plurality of liquids may be individually supplied to a chemical mechanical polishing apparatus to prepare a chemical mechanical polishing aqueous dispersion on a platen.

2.1 First Kit

A first chemical mechanical polishing aqueous dispersion preparation kit according to this embodiment (hereinafter may be referred to as "kit") includes a liquid (I) that is an aqueous dispersion including water, the graft polymer (A), and the abrasive grains (B), and a liquid (II) that includes water and an oxidizing agent, the above chemical mechanical polishing aqueous dispersion being prepared by mixing the liquids (I) and (II).

The concentration of each component in the liquids (I) and (II) is not particularly limited insofar as the concentration of each component in the chemical mechanical polishing aqueous dispersion prepared by mixing the liquids (I) and (II) falls within the above range. For example, the liquids (I) and (II) are prepared so that the liquids (I) and (II) contain each component at a concentration higher than that of the desired chemical mechanical polishing aqueous dispersion, optionally diluted before use, and mixed to obtain a chemical mechanical polishing aqueous dispersion in which the concentration of each component falls within the above range. Specifically, when mixing the liquids (I) and (II) in a weight ratio of 1:1, the liquids (I) and (II) are prepared so that the concentration of each component is twice that of the desired chemical mechanical polishing aqueous dispersion. Alternatively, the liquids (I) and (II) may be prepared so that the concentration of each component is equal to or more than twice that of the desired chemical mechanical polishing aqueous dispersion, and mixed in a weight ratio of 1:1. The mixture may be diluted with water so that each component is contained at the desired concentration.

The storage stability of the aqueous dispersion (particularly the storage stability of the liquid (II) that includes the oxidizing agent) can be improved by separately preparing the liquids (I) and (II).

When using the first kit, the liquids (I) and (II) may be mixed by an arbitrary method at an arbitrary timing insofar as the chemical mechanical polishing aqueous dispersion can be prepared before polishing. For example, the chemical mechanical polishing aqueous dispersion may be prepared by mixing the liquids (I) and (II), and supplied to a chemical mechanical polishing apparatus. Alternatively, the liquids (I) and (II) may be separately supplied to a chemical mechanical polishing apparatus, and mixed on a platen. Alternatively, the liquids (I) and (II) may be separately supplied to a chemical mechanical polishing apparatus, and mixed in a line of the chemical mechanical polishing apparatus, or mixed in a mixing tank that is provided in the chemical mechanical polishing apparatus. A line mixer or the like may be used to obtain a more uniform aqueous dispersion.

The additives (i.e., organic acid, water-soluble polymer, and surfactant) are optionally added to at least one liquid selected from the liquids (I) and (II).

2.2 Second Kit

A second kit according to this embodiment includes a liquid (III) that includes water and the graft polymer (A), and a liquid (IV) that is an aqueous dispersion including water and the abrasive grains (B), the above chemical mechanical polishing aqueous dispersion being prepared by mixing the liquids (III) and (IV). Either or both of the liquids (III) and (IV) include the oxidizing agent.

The concentration of each component in the liquids (III) and (IV) is not particularly limited insofar as the concentration of each component in the chemical mechanical polishing aqueous dispersion prepared by mixing the liquids (III) and (IV) falls within the above range. For example, the liquids (III) and (IV) are prepared so that the liquids (III) and (IV) contain each component at a concentration higher than that of the chemical mechanical polishing aqueous dispersion, optionally diluted before use, and mixed to obtain a chemical mechanical polishing aqueous dispersion in which the concentration of each component falls within the above range. Specifically, when mixing the liquids (III) and (IV) in a weight ratio of 1:1, the liquids (III) and (IV) are prepared so that the concentration of each component is twice that of the desired chemical mechanical polishing aqueous dispersion. Alternatively, the liquids (III) and (IV) may be prepared so that the concentration of each component is equal to or more than twice that of the desired chemical mechanical polishing aqueous dispersion, and mixed in a weight ratio of 1:1. The mixture may be diluted with water so that each component is contained at the desired concentration.

The storage stability of the aqueous dispersion can be improved by separately preparing the liquids (III) and (IV).

When using the second kit, the liquids (III) and (IV) may be mixed by an arbitrary method at an arbitrary timing insofar as the above chemical mechanical polishing aqueous dispersion can be prepared before polishing. For example, the chemical mechanical polishing aqueous dispersion may be prepared by mixing the liquids (III) and (IV), and supplied to a chemical mechanical polishing apparatus. Alternatively, the liquids (III) and (IV) may be separately supplied to a chemical mechanical polishing apparatus, and mixed on a platen. Alternatively, the liquids (III) and (IV) may be separately supplied to a chemical mechanical polishing apparatus, and mixed in a line of the chemical mechanical polishing apparatus, or mixed in a mixing tank that is provided in the chemical mechanical polishing apparatus. A line mixer or the like may be used to obtain a more uniform aqueous dispersion.

The additives (i.e., organic acid, water-soluble polymer, and surfactant) are optionally added to at least one liquid selected from the liquids (III) and (IV).

2.3 Third Kit

A third kit according to this embodiment includes a liquid (V) that includes water and the graft polymer (A), a liquid (VI) that is an aqueous dispersion including water and the abrasive grains (B), and a liquid (VII) that includes water and the oxidizing agent, the above chemical mechanical polishing aqueous dispersion being prepared by mixing the liquids (V), (VI), and (VII).

The concentration of each component in the liquids (V), (VI), and (VII) is not particularly limited insofar as the concentration of each component in the chemical mechanical polishing aqueous dispersion prepared by mixing the liquids (V), (VI), and (VII) falls within the above range. For example, the liquids (V), (VI), and (VII) are prepared so that the liquids (V), (VI), and (VII) contain each component at a concentration higher than that of the chemical mechanical polishing aqueous dispersion, optionally diluted before use, and mixed to obtain a chemical mechanical polishing aqueous dispersion in which the concentration of each component falls within the above range. Specifically, when mixing the liquids (V), (VI), and (VII) in a weight ratio of 1:1:1, the liquids (V), (VI), and (VII) are prepared so that the concentration of each component is three times that of the desired chemical mechanical polishing aqueous dispersion. Alternatively, the liquids (V), (VI), and (VII) may be prepared so that the concentration of each component is equal to or more than three times that of the desired chemical mechanical polishing aqueous dispersion, and mixed in a weight ratio of 1:1:1. The mixture may be diluted with water so that each component is contained at the desired concentration.

The storage stability of the aqueous dispersion (particularly the storage stability of the liquid (VII) that includes the oxidizing agent) can be improved by separately preparing the liquids (V), (VI), and (VII).

When using the third kit, the liquids (V), (VI), and (VII) may be mixed by an arbitrary method at an arbitrary timing insofar as the above chemical mechanical polishing aqueous dispersion can be prepared before polishing. For example, the chemical mechanical polishing aqueous dispersion may be prepared by mixing the liquids (V), (VI), and (VII), and supplied to a chemical mechanical polishing apparatus. Alternatively, the liquids (V), (VI), and (VII) may be separately supplied to a chemical mechanical polishing apparatus, and mixed on a platen. Alternatively, the liquids (V), (VI), and (VII) may be separately supplied to a chemical mechanical polishing apparatus, and mixed in a line of the chemical mechanical polishing apparatus, or mixed in a mixing tank that is provided in the chemical mechanical polishing apparatus. A line mixer or the like may be used to obtain a more uniform aqueous dispersion.

The additives (i.e., organic acid, water-soluble polymer, and surfactant) are optionally added to at least one liquid selected from the liquids (V), (VI), and (VII).

3. Chemical Mechanical Polishing Method

A chemical mechanical polishing method according to another embodiment of the invention includes polishing a polishing target surface that includes at least a low-dielectric-constant insulating film using the above chemical mechanical polishing aqueous dispersion. The chemical mechanical polishing method according to this embodiment may be applied to a wide range of chemical mechanical polishing processes used to produce semiconductor devices. In particular, the chemical mechanical polishing method according to this embodiment may be suitably applied to a process that polishes a polishing target surface that includes a low-dielectric-constant insulating film. A low-dielectric-constant insulating film normally has a porous structure in order to implement a low dielectric constant. Therefore, the polishing rate may increase to a large extent when polishing a low-dielectric-constant insulating film using a known chemical mechanical polishing aqueous dispersion. On the other hand, when polishing a polishing target surface that includes a low-dielectric-constant insulating film using the chemical mechanical polishing aqueous dispersion according to this embodiment, the polishing target surface can be polished without causing a change in electrical properties (e.g., dielectric constant) while maintaining a practical polishing rate. A metal film (e.g., copper) or a barrier metal film (e.g., tantalum, titanium, ruthenium, cobalt, or a nitride thereof) can also be polished by the chemical mechanical polishing method according to the invention at a practical polishing rate.

The chemical mechanical polishing aqueous dispersion according to this embodiment may be implemented using a commercially available chemical mechanical polishing apparatus. Examples of a commercially available chemical mechanical polishing apparatus include "EPO-112", "EPO-222" (manufactured by Ebara Corporation), "LGP510", "LGP552" (manufactured by Lapmaster SFT Corporation), "Mirra" (manufactured by Applied Materials, Inc.), and the like.

4. Examples

The invention is further described below by way of examples. Note that the invention is not limited to the following examples.

4.1 Preparation of Aqueous Dispersion Including Inorganic Particles 4.1.1 Preparation of Aqueous Dispersion Including Colloidal Silica Particles A flask was charged with 70 parts by mass of 25 mass % aqueous ammonia, 40 parts by mass of ion-exchanged water, 170 parts by mass of ethanol, and 20 parts by mass of tetraethoxysilane. The mixture was heated to 60° C. with stirring at a rotational speed of 180 rpm. After stirring the mixture at 60° C., the mixture was cooled to room temperature to obtain a colloidal silica particle alcohol dispersion.

An operation of removing the alcohol from the dispersion using a rotary evaporator while adding ion-exchanged water was repeated several times. The alcohol was thus removed to obtain an aqueous dispersion C1 including 20 mass % of colloidal silica particles. The average primary particle diameter of the colloidal silica particles included in the aqueous dispersion C1 determined using a transmission electron microscope (TEM) ("H-7500" manufactured by Hitachi Ltd.) was 25 nm. The average secondary particle diameter of the colloidal silica particles determined using a dynamic light scattering particle size analyzer ("HORIBA LB550" manufactured by Horiba Ltd.) was 50 nm. An aqueous dispersion C2 including 20 mass % of colloidal silica particles (average primary particle diameter: 35 nm, average secondary particle diameter: 90 nm) and an aqueous dispersion C3 including 20 mass % of colloidal silica particles (average primary particle diameter: 35 nm, average secondary particle diameter: 70 nm) were prepared in the same manner as described above, except for changing the amounts of aqueous ammonia, ethanol, and tetraethoxysilane and the temperature employed during stirring.

An aqueous dispersion C4 including colloidal silica particles was prepared as follows. Specifically, No. 3 water glass (silica concentration: 24 mass %) was diluted with water to prepare a diluted sodium silicate aqueous solution having a silica concentration of 3.0 mass %. The diluted sodium silicate aqueous solution was passed through a hydrogen cation-exchange resin layer to obtain an active silica aqueous solution (pH: 3.1) from which most of the sodium ions were removed. The pH of the active silica aqueous solution was immediately adjusted to 7.2 by adding a 10 mass % potassium hydroxide aqueous solution with stirring. The mixture was then boiled and aged for three hours. The active silica aqueous solution (10-fold amount), of which the pH was adjusted to 7.2, was gradually added to the resulting aqueous solution over six hours so that the average particle size of the silica particles increased to 26 nm. The aqueous dispersion including the silica particles was concentrated under vacuum (boiling point: 78° C.) to obtain a silica particle dispersion (silica concentration: 32 mass %, average particle size of silica: 26 nm, pH: 9.8). The silica particle dispersion was passed through the hydrogen cation-exchange resin layer to remove most of the sodium ions. A 10 mass % potassium hydroxide aqueous solution was then added to the dispersion to obtain an aqueous dispersion C4 including 28.0 mass % of colloidal silica particles.

4.2 Preparation of Aqueous Dispersion Including Organic Particles

A flask was charged with 90 parts by mass of methyl methacrylate, 5 parts by mass of methoxy polyethylene glycol methacrylate ("NK Ester M-90G #400" manufactured by Shin-Nakamura Chemical Co., Ltd.), 5 parts by mass of 4-vinylpyridine, 2 parts by mass of an azo initiator ("V50" manufactured by Wako Pure Chemical Industries, Ltd.), and 400 parts by mass of ion-exchanged water. The mixture was heated to 70° C. with stirring in a nitrogen gas atmosphere. The mixture was stirred at 70° C. for six hours. The reaction mixture was diluted with ion-exchanged water to obtain an aqueous dispersion including 10 mass % of polymethyl methacrylate particles having an average particle diameter of 150 nm and including a cation of an amino group and a polyethylene glycol chain. The polymerization yield was 95%.

After the addition of 1 part by mass of methyltrimethoxysilane to 100 parts by mass of the aqueous dispersion, the mixture was stirred at 40° C. for two hours. The pH of the mixture was adjusted to 2.0 by adding a 1N nitric acid aqueous solution to obtain an aqueous dispersion including organic particles.

4.3 Graft Polymer Including Anionic Functional Group

As a graft polymer including an anionic functional group, a graft polymer "Malialim AKM1511-60" (manufactured by NOF Corporation) (hereinafter referred to as "P1") was used. The polystyrene-reduced weight average molecular weight (Mw) of the graft polymer P1 determined by gel permeation chromatography (instrument: "Alliance 2695" manufactured by Waters, column: "G4000HXL+G2000HXL", eluant: THF) was 3700. A graft polymer "Malialim AFB-1521" (manufactured by NOF Corporation, Mw: 130,000) (hereinafter referred to as "P2") and a graft polymer "Malialim AKM-0531" (manufactured by NOF Corporation, Mw: 10,000) (hereinafter referred to as "P3") including an anionic functional group and differing in type of monomer from the graft polymer P1 were also used.

A separable flask was charged with 600 g of ion-exchanged water. After increasing the liquid temperature to 70° C. with stirring, 60 g of 1.0% ammonium persulfate was added to the flask. When the liquid temperature had reached 75° C., a solution prepared by mixing acrylic acid and monomers in a molar ratio shown in Table 4 so that the total mass was 150 g, followed by the addition of 100 g of ion-exchanged water, was continuously added to the flask over three hours. The liquid temperature was maintained at 75 to 80° C. during this operation. The mixture was then cooled to obtain a graft polymer P4 including 10 mass % of a comb-shaped graft polymer including an anionic functional group in the trunk polymer. The polyethylene glycol-reduced weight average molecular weight (Mw) of the graft polymer P4 determined by gel permeation chromatography (instrument: "Alliance 2695" manufactured by Waters, column: "TSK-GEL alpha-M", eluant: NaCl aqueous solution/acetonitrile) was 520,000.

A separable flask was charged with 570 g of ion-exchanged water and 100 g of 10% ammonium dodecylbenzenesulfonate. After increasing the liquid temperature to 70° C. with stirring, 80 g of 1.0% ammonium persulfate was added to the flask. When the liquid temperature had reached 75° C., a solution prepared by mixing monomers in a molar ratio shown in Table 4 so that the total mass was 200 g, followed by the addition of 100 g of 10% ammonium dodecylbenzenesulfonate, was continuously added to the flask over three hours. The liquid temperature was maintained at 75 to 80° C. during this operation. The mixture was then cooled to obtain a graft polymer P5 including 10 mass % of a comb-shaped graft polymer including an anionic functional group in the trunk polymer. The polyethylene glycol-reduced weight average molecular weight (Mw) of the graft polymer P5 determined by gel permeation chromatography (instrument: "Alliance 2695" manufactured by Waters, column: "TSK-GEL alpha-M", eluant: NaCl aqueous solution/acetonitrile) was 67,000.

A separable flask was charged with 630 g of ion-exchanged water and 100 g of 10% ammonium dodecylbenzenesulfonate. After increasing the liquid temperature to 70° C. with stirring, 100 g of 1.0% ammonium persulfate was added to the flask. When the liquid temperature had reached 75° C., a solution prepared by mixing monomers in a molar ratio shown in Table 4 so that the total mass was 200 g, followed by the addition of 80 g of 10% ammonium dodecylbenzenesulfonate, was continuously added to the flask over three hours. The liquid temperature was maintained at 75 to 80° C. during this operation. The mixture was then cooled to obtain a graft polymer P6 including 10 mass % of a comb-shaped graft polymer including an anionic functional group in the trunk polymer. The polyethylene glycol-reduced weight average molecular weight (Mw) of the graft polymer P6 determined by gel permeation chromatography (instrument: "Alliance 2695" manufactured by Waters, column: "TSK-GEL alpha-M", eluant: NaCl aqueous solution/acetonitrile) was 163,000.

A separable flask was charged with 430 g of ion-exchanged water and 100 g of 10% ammonium dodecylbenzenesulfonate. After increasing the liquid temperature to 70° C. with stirring, 60 g of 1.0% ammonium persulfate was added to the flask. When the liquid temperature had reached 75° C., a solution prepared by mixing monomers in a molar ratio shown in Table 4 so that the total mass was 200 g, followed by the addition of 80 g of 10% ammonium dodecylbenzenesulfonate and 100 g of ion-exchanged water, was continuously added to the flask over three hours. The liquid temperature was maintained at 75 to 80° C. during this operation. The mixture was then cooled to obtain a graft polymer P7 including 10 mass % of a comb-shaped graft polymer including an anionic functional group in the trunk polymer. The polyethylene glycol-reduced weight average molecular weight (Mw) of the graft polymer P7 determined by gel permeation chromatography (instrument: "Alliance 2695" manufactured by Waters, column: "TSK-GEL alpha-M", eluant: NaCl aqueous solution/acetonitrile) was 222,000.

A separable flask was charged with 550 g of ion-exchanged water and 80 g of 10% ammonium dodecylbenzenesulfonate. After increasing the liquid temperature to 70° C. with stirring, 60 g of 1.0% ammonium persulfate was added to the flask. When the liquid temperature had reached 75° C., a solution prepared by mixing monomers in a molar ratio shown in Table 4 so that the total mass was 200 g, followed by the addition of 90 g of 10% ammonium dodecylbenzenesulfonate, was continuously added to the flask over three hours. The liquid temperature was maintained at 75 to 80° C. during this operation. The mixture was then cooled to obtain a graft polymer P8 including 10 mass % of a comb-shaped graft polymer including an anionic functional group in the trunk polymer. The polyethylene glycol-reduced weight average molecular weight (Mw) of the graft polymer P8 determined by gel permeation chromatography (instrument: "Alliance 2695" manufactured by Waters, column: "TSK-GEL alpha-M", eluant: NaCl aqueous solution/acetonitrile) was 53,000.

4.4 Preparation of Chemical Mechanical Polishing Aqueous Dispersion 4.4.1 Preparation of Dispersion A 0.2 mass % of the graft polymer P1 including an anionic functional group, 5 mass % of the colloidal silica aqueous dispersion C3, 0.8 mass % of maleic acid, 0.2 mass % of polyacrylic acid (Mw: 1,200,000), and ion-exchanged water were mixed so that the total amount of the components was 100 mass %, and stirred for one hour. The mixture was filtered through a filter having a pore diameter of 5 micrometers. The pH of the mixture was then adjusted to 9.5 using KOH to obtain a dispersion A shown in Table 1. The unit of the content of each component shown in Table 1 is mass %. The component other than the components shown in Table 1 is water.

4.4.2 Preparation of Dispersion B 0.4 mass % of the graft polymer P3 including an anionic functional group, 2.4 mass % of maleic acid, 0.2 mass % of quinolinic acid, 0.8 mass % of polyacrylic acid (Mw: 1,200,000), and ion-exchanged water were mixed so that the total amount of the components was 100 mass %, and stirred for one hour. The mixture was filtered through a filter having a pore diameter of 5 micrometers. The pH of the mixture was then adjusted to about 12.6 using KOH to obtain a dispersion B-1 shown in Table 3. 18.0 mass % of the colloidal silica C2 and ion-exchanged water were mixed so that the total amount of the components was 100 mass %, and stirred for one hour. The mixture was filtered through a filter having a pore diameter of 5 micrometers. The pH of the mixture was then adjusted to about 10.0 using KOH to obtain a dispersion B-2 shown in Table 3. Table 3 shows an example when using the dispersions B-1 and B-2 as a kit.

The dispersions B-1 and B-2 thus prepared were stored at room temperature for two months. After storage, 50 parts by mass of the dispersion B-1 and 50 parts by mass of the dispersion B-2 were mixed, and diluted with water immediately before use to prepare a dispersion B shown in Table 1.

4.4.3 Preparations of Dispersions C to N

Dispersions C to N were prepared in the same manner as the dispersion A, except for changing the composition (polymer and other components) as shown in Table 1 or 2. In Table 1 and 2, "PAA" refers to polyacrylic acid (Mw: 1,200,000), "MDPOE" refers to 2,4,7,9-tetramethyl-5-decyne-4,7-diol dipolyoxyethylene ether, and "ASDK" refers to a dipotassium alkenylsuccinate.

TABLE 1

|  |  | Example 1 Dispersion A | Example 2 Dispersion B | Example 3 Dispersion C | Example 4 Dispersion D | Example 5 Dispersion E | Example 6 Dispersion I | Example 7 Dispersion J |
|---|---|---|---|---|---|---|---|---|
| Graft polymer (A) | Type | P1 | P3 | P1 | P3 | P2 | P2 | P4 |
|  | Weight average molecular weight (Mw) | 3700 | 10000 | 3700 | 10000 | 130000 | 130000 | 520000 |
|  | Concentration (mass %) | 0.2 | 0.1 | 0.1 | 0.4 | 0.1 | 0.3 | 0.1 |
| Abrasive grains (B) | Type | Colloidal silica C3 | Colloidal silica C2 | Colloidal silica C3 | Colloidal silica C2 | Colloidal silica C2 | Colloidal silica C4 | Colloidal silica C2 |
|  | Concentration (mass %) | 5.0 | 4.5 | 5.0 | 4.5 | 4.5 | 7.0 | 4.5 |
|  | Type | — | — | — | Organic particles | — | — | Colloidal silica C4 |
|  | Concentration (mass %) | — | — | — | 0.1 | — | — | 0.5 |
| Organic acid | Type | Maleic acid | Maleic acid | Maleic acid | Maleic acid | Maleic acid | Maleic acid | Maleic acid |
|  | Concentration (mass %) | 0.8 | 0.6 | 0.8 | 0.6 | 0.6 | 0.6 | 0.7 |
|  | Type | — | Quinolinic acid | Quinolinic acid | Quinaldic acid | Quinolinic acid | Quinolinic acid | — |
|  | Concentration (mass %) | — | 0.05 | 0.05 | 0.3 | 0.05 | 0.07 | — |
| Water-soluble polymer | Type | PAA | PAA | — | PAA | PAA | PAA | PAA |
|  | Concentration (mass %) | 0.2 | 0.2 | — | 0.2 | 0.2 | 0.2 | 0.2 |
| Surfactant | Type | — | — | — | — | — | MDPOE | ASDK |
|  | Concentration (mass %) | — | — | — | — | — | 0.001 | 0.2 |
| pH adjusting agent | Type | KOH | KOH | KOH | KOH | KOH | KOH | KOH |
| pH |  | 9.5 | 9.6 | 9.5 | 9.3 | 10.0 | 9.7 | 9.1 |
| Content ratio (A B) of component (A) to component (B) |  | 0.04 | 0.02 | 0.02 | 0.09 | 0.02 | 0.04 | 0.02 |
| Evaluation of polishing rate | Cu film polishing rate (angstroms min) | 350 | 590 | 400 | 590 | 480 | 530 | 340 |
|  | TaN film polishing rate (angstroms min) | 750 | 900 | 750 | 900 | 800 | 730 | 800 |
|  | LKD film polishing rate (angstroms min) | 90 | 360 | 70 | 120 | 55 | 250 | 270 |
|  | Cu LKD polishing rate ratio | 3.89 | 1.64 | 5.71 | 4.92 | 8.73 | 2.12 | 1.26 |
|  | TaN LKD polishing rate ratio | 8.33 | 2.50 | 10.71 | 7.50 | 14.55 | 2.92 | 2.96 |
|  | Cu Ta polishing rate ratio | 0.47 | 0.66 | 0.53 | 0.66 | 0.60 | 0.73 | 0.43 |
|  | Evaluation | Excellent | Good | Excellent | Excellent | Excellent | Excellent | Good |
| Evaluation of LKD relative dielectric constant | k-value (25° C.) | 2.6 | 2.4 | 2.6 | 2.4 | 3.3 | 3.2 | 2.4 |
|  | k-value (200° C.) | 2.2 | 2.2 | 2.2 | 2.2 | 2.5 | 2.5 | 2.2 |
|  | Dk (k-value (25° C.) − k-value (200° C.)) | 0.4 | 0.2 | 0.4 | 0.2 | 0.8 | 0.7 | 0.2 |
|  | Evaluation | Good | Good | Good | Good | Good | Good | Good |
| Evaluation of scratches | Number of scratches (area) | 13 | 15 | 12 | 18 | 5 | 8 | 9 |
|  | Evaluation | Fair | Fair | Fair | Fair | Good | Good | Good |

TABLE 2

|  |  | Example 8 Dispersion K | Example 9 Dispersion L | Example 10 Dispersion M | Example 11 Dispersion N | Comparative Example 1 Dispersion F | Comparative Example 2 Dispersion G | Comparative Example 3 Dispersion H |
|---|---|---|---|---|---|---|---|---|
| Graft polymer (A) | Type | P5 | P6 | P7 | P8 | — | — | P3 |
|  | Weight average molecular weight (Mw) | 67000 | 163000 | 222000 | 53000 | — | — | 10000 |
|  | Concentration (mass %) | 0.1 | 0.2 | 0.2 | 0.1 | — | — | 0.1 |
| Abrasive grains (B) | Type | Colloidal silica C2 | Colloidal silica C2 | Colloidal silica C2 | Colloidal silica C4 | Colloidal silica C2 | Colloidal silica C1 | — |
|  | Concentration (mass %) | 4.0 | 4.5 | 45 | 6.0 | 4.5 | 5.0 | — |
|  | Type | — | — | — | — | — | — | — |
|  | Concentration (mass %) | — | — | — | — | — | — | — |
| Organic acid | Type | Maleic acid | Maleic acid | Maleic acid | Maleic acid | Maleic acid | Maleic acid | Maleic acid |
|  | Concentration (mass %) | 0.6 | 0.6 | 0.6 | 0.4 | 0.6 | 0.6 | 0.6 |
|  | Type | Quinolinic acid | Quinolinic acid | — | — | Quinolinic acid | Quinolinic acid | Quinolinic acid |
|  | Concentration (mass %) | 0.05 | 0.1 | — | — | 0.05 | 0.05 | 0.05 |
| Water-soluble polymer | Type | — | PAA | PAA | PAA | PAA | PAA | — |
|  | Concentration (mass %) | — | 0.2 | 0.05 | 0.05 | 0.2 | 0.2 | — |
| Surfactant | Type | — | — | — | — | — | MDPOE | — |
|  | Concentration (mass %) | — | — | — | — | — | 0.1 | — |
| pH adjusting agent | Type | KOH | KOH | KOH | KOH | KOH | KOH | KOH |
| pH |  | 9.6 | 9.2 | 9.0 | 9.5 | 9.9 | 9.5 | 10.9 |
| Content ratio (A B) of component (A) to component (B) |  | 0.03 | 0.04 | 0.04 | 0.02 | — | — | — |
| Evaluation of polishing rate | Cu film polishing rate (angstroms min) | 500 | 550 | 510 | 450 | 600 | 550 | 60 |
|  | TaN film polishing rate (angstroms min) | 830 | 820 | 870 | 700 | 950 | 900 | 5 |
|  | LKD film polishing rate (angstroms min) | 200 | 150 | 250 | 70 | 3690 | 200 | 30 |
|  | Cu LKD polishing rate ratio | 2.50 | 3.67 | 2.04 | 6.43 | 0.16 | 2.75 | 2.00 |
|  | TaN LKD polishing rate ratio | 4.15 | 5.47 | 3.48 | 10.00 | 0.26 | 4.50 | 0.17 |
|  | Cu Ta polishing rate ratio | 0.60 | 0.67 | 0.59 | 0.64 | 0.63 | 0.61 | 12.00 |
|  | Evaluation | Excellent | Excellent | Excellent | Excellent | Bad | Excellent | Excellent |
| Evaluation of LKD relative dielectric constant | k-value (25° C.) | 3.6 | 3.1 | 3.0 | 3.4 | 2.4 | 3.6 | 2.4 |
|  | k-value (200° C.) | 2.6 | 2.4 | 2.3 | 2.5 | 2.2 | 2.5 | 2.2 |
|  | Dk (=k-value (25° C.) − k-value (200° C.)) | 1.0 | 0.7 | 0.8 | 0.9 | 0.2 | 1.1 | 0.2 |
|  | Evaluation | Good | Good | Good | Good | Good | Bad | Good |
| Evaluation of scratches | Number of scratches (area) | 4 | 8 | 5 | 7 | 32 | 21 | 16 |
|  | Evaluation | Good | Good | Good | Good | Bad | Bad | Fair |

TABLE 3

|  |  | Example 2 | |
|---|---|---|---|
|  |  | Dispersion B-1 | Dispersion B-2 |
| Graft polymer (A) | Type | P3 | — |
|  | Concentration (mass %) | 0.4 | — |
| Abrasive grains (B) | Type | — | Colloidal silica C2 |
|  | Concentration (mass %) | — | 18.0 |
| Organic acid | Type | Maleic acid | — |
|  | Concentration (mass %) | 2.4 | — |
|  | Type | Quinolinic acid | — |
|  | Concentration (mass %) | 0.2 | — |
| Water-soluble polymer | Type | PAA | — |
|  | Concentration (mass %) | 0.8 | — |
| Surfactant | Type | — | — |
|  | Concentration (mass %) | — | — |
| pH adjusting agent | Type | KOH | KOH |
|  | pH | 12.6 | 10.0 |

TABLE 4

| Graft polymer | Monomer composition | | | Molar ratio of monomers | | |
|---|---|---|---|---|---|---|
| | Type of monomer | | | | | |
| | (I) | (II) | (III) | (I) | (II) | (III) |
| P4 | Acrylic acid | Polyethylene glycol monomethacrylate (l = 8. m = 0. n = 0) | — | 2 | 8 | — |
| P5 | Acrylic acid | Polyethylene glycol monomethacrylate (l = 8. m = 0. n = 0) | Polypropylene glycol monomethacrylate (l = 0. m = 5. n = 0) | 2 | 5 | 3 |
| P6 | Acrylic acid | Polyethylene glycol monomethacrylate (l = 8. m = 0. n = 0) | Polypropylene glycol monomethacrylate (l = 0. m = 5. n = 0) | 2 | 6 | 2 |
| P7 | Acrylic acid | Polyethylene glycol monomethacrylate (l = 8. m = 0. n = 0) | Polypropylene glycol monomethacrylate (l = 0. m = 5. n = 0) | 2 | 6 | 2 |
| P8 | Acrylic acid | Poly(ethylene glycol-tetramethylene glycol) monomethacrylate (l = 10. m = 0. n = 5) | — | 3 | 7 | — |

4.5 Chemical Mechanical Polishing Test 4.5.1 Evaluation of Polishing Rate, Relative Dielectric Constant, and Scratches A porous polyurethane polishing pad ("IC1000" manufactured by Nitta Haas Inc.) was installed in a chemical mechanical polishing apparatus ("Mirra" manufactured by Applied Materials, Inc.). A polishing rate measurement substrate was polished for one minute under the following polishing conditions while supplying a given chemical mechanical polishing aqueous dispersion. The polishing rate was calculated by the following method.

(1) Polishing Rate Measurement Substrate 8-inch silicon substrate with thermal oxide film on which a copper film having a thickness of 15,000 angstroms was stacked 8-inch silicon substrate with thermal oxide film on which a tantalum nitride film having a thickness of 2000 angstroms was stacked 8-inch silicon substrate on which an MSQ low-dielectric-constant insulating material having a porous structure ("LKD5525" manufactured by JSR Corporation, relative dielectric constant k: 2.2) was deposited to a thickness of 5000 angstroms (2) Polishing Conditions Head rotational speed: 130 rpm
Platen rotational speed: 130 rpm
Head load: 1.5 psi
Chemical mechanical polishing aqueous dispersion supply rate: 200 ml/min Note that the term "chemical mechanical polishing aqueous dispersion supply rate" refers to the total amount of the chemical mechanical polishing aqueous dispersion supplied per unit time.

(3) Calculation of Polishing Rate

The thickness of a copper film or a tantalum nitride film was measured after polishing using an electric conduction-type thickness measurement system ("OmniMap RS75" manufactured by KLA-Tencor Corporation). The polishing rate was calculated from the reduction in thickness due to chemical mechanical polishing and the polishing time.

The thickness of an LKD film was measured after polishing using an optical interference-type thickness measurement system ("NanoSpec 6100" manufactured by Nanometrics Japan Ltd.). The polishing rate was calculated from the reduction in thickness due to chemical mechanical polishing and the polishing time.

(4) Measurement of Relative Dielectric Constant

A film-shaped aluminum electrode was deposited using a deposition system ("VPC-410" manufactured by ULAVX), and the area of the electrode was measured. The relative dielectric constant of a low-dielectric-constant insulating film was measured (25° C., 100 kHz, 1 V) using a measurement system ("4284A" manufactured by Hewlett-Packard) by utilizing a hot plate on which the aluminum electrode and the measurement target insulating film were disposed.

After increasing the temperature to 200° C. in dry air, the relative dielectric constant of the low-dielectric-constant insulating film was again measured in the same manner as described above.

(5) Evaluation of Relative Dielectric Constant

The degree of damage sustained by the low-dielectric-constant insulating film can be determined by calculating the difference (Dk) between the relative dielectric constant measured at 25° C. and the relative dielectric constant measured at 200° C. after polishing. A large difference (Dk) indicates that the low-dielectric-constant insulating film was damaged to a large extent due to polishing. A large difference between the relative dielectric constant measured at 200° C. after polishing and the relative dielectric constant measured before polishing indicates that the low-dielectric-constant insulating film is easily damaged. The degree of damage sustained by the low-dielectric-constant insulating film was thus estimated.

(6) Evaluation of Scratches 200 unit areas (120×120 micrometers) of the low-dielectric-constant insulating film subjected to polishing were randomly observed in a dark field using an optical microscope, and the number of scratches in each unit area was measured.

Evaluation tests were performed using the dispersions A to N based on the test methods described in the sections "Evaluation of polishing rate", "Evaluation of relative dielectric constant", and "Evaluation of scratches". The results are shown in Tables 1 and 2. The evaluation item "Cu/LKD" indicates the Cu/LKD polishing rate ratio. The Cu/LKD polishing rate ratio is preferably 1 to 10 (indicated by "Good" in Tables 1 and 2) so that flatness can be achieved when polishing an actual device. The Cu/LKD polishing rate ratio is most preferably 2 to 9 (indicated by "Excellent" in Tables 1 and 2). A case where the Cu/LKD polishing rate ratio was outside the above range (i.e., cannot be applied to an actual device) is indicated by "Bad" in Tables 1 and 2 (flatness evaluation).

The evaluation item "k-value (200° C.)" indicates the relative dielectric constant measured at 200° C. after polishing. The evaluation item "Dk" indicates the difference between the relative dielectric constant measured at 25° C. and the relative dielectric constant measured at 200° C. after polishing. The Dk-value is an index that indicates damage sustained by the low-dielectric-constant insulating film due to polishing. A large Dk-value indicates that the low-dielectric-constant insulating film was damaged to a large extent. The Dk-value is preferably 0 to 1 (indicated by "Good" in Tables 1 and 2). A case where the Dk-value was outside the above range (i.e., cannot be applied to an actual device) is indicated by "Bad" in Tables 1 and 2 (electrical property evaluation).

The evaluation item "number of scratches" is preferably 0 to 10 (indicated by "Good" in Tables 1 and 2) so that an excellent polishing process can be achieved when polishing an actual device. A case where the number of scratches was 10 to 20 (i.e., actual application may be impossible) is indicated by "Fair" in Tables 1 and 2. A case where the number of scratches was outside the above range (i.e., cannot be applied to an actual device) is indicated by "Bad" in Tables 1 and 2 (defect evaluation).

(7) Evaluation Results

From the results of Examples 1 to 11, it was confirmed that the chemical mechanical polishing aqueous dispersion according to the invention exhibits excellent polishing performance due to the graft polymer that includes an anionic functional group in the trunk polymer. It was found that occurrence of scratches can be significantly reduced when the chemical mechanical polishing aqueous dispersion includes the graft polymer that includes an anionic functional group and has a weight average molecular weight of 50,000 to 800,000 (P2, P4, P5, P6, P7, and P8). From the results of Example 2, it was confirmed that a chemical mechanical polishing aqueous dispersion that exhibits excellent storage stability can be prepared using the chemical mechanical polishing aqueous dispersion according to the invention as a kit.

In Comparative Examples 1 and 2, excellent results could not be obtained since the chemical mechanical polishing aqueous dispersion did not include a graft polymer that includes an anionic functional group in the trunk polymer.

In Comparative Example 1, since the chemical mechanical polishing aqueous dispersion did not include a graft polymer that includes an anionic functional group, the polishing rate of the LKD film could not be reduced, so that the LKD film tended to be excessively polished.

The chemical mechanical polishing aqueous dispersion of Comparative Example 2 included MDPOE that corresponds to a branch polymer. However, the result for the relative dielectric constant after polishing was bad (i.e., an excellent polished surface cannot be obtained).

In Comparative Example 3, since the chemical mechanical polishing aqueous dispersion did not include abrasive grains, a sufficient polishing rate could not be obtained for the Cu film, the TaN film, and the LKD film (i.e., cannot be applied to an actual device).

As is clear from the above results, it was confirmed that the effects of the invention can be achieved by utilizing the chemical mechanical polishing aqueous dispersion that includes the graft polymer (A) that includes an anionic functional group in a trunk polymer, and the abrasive grains (B).

The invention claimed is:

1. A chemical mechanical polishing aqueous dispersion comprising:
(A) a graft polymer comprising a repeating unit of formula (1) and a repeating unit of formula (3), (4), or (5):

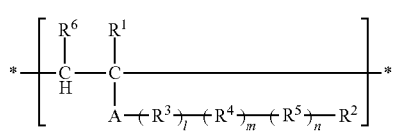
(1)

wherein in formula (1),
$R^1$ is a hydrogen atom or a substituted or unsubstituted alkyl group having 1 to 6 carbon atoms,
$R^2$ is a hydrogen atom or a substituted or unsubstituted alkyl group having 1 to 12 carbon atoms,
A is a single bond, —O—, or an oxyalkylene group having 1 to 9 carbon atoms,
wherein the oxyalkylene group is —$C_qH_{2q}$O— and q is an integer of from 1 to 9,
$R^3$, $R^4$, and $R^5$ are each independently a structural unit selected from the group consisting of —$C_2H_4O$—, —$C_3H_6O$—, and —$C_4H_8O$—,
l, m, and n are each independently an integer of from 0 to 100,
l+n+m>0,
$R^6$ is a hydrogen atom or a carboxyl group, and
* is a bonding hand,

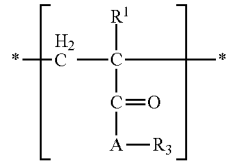
(3)

wherein in formula (3),
$R^1$ is a hydrogen atom or a substituted or unsubstituted alkyl group having 1 to 6 carbon atoms,
$R^3$ is a hydrogen atom or a substituted or unsubstituted alkyl group having 1 to 12 carbon atoms,
A is a single bond, —O—, or —NH—, and
* is a bonding hand,

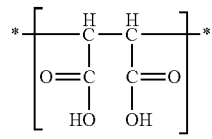
(4)

wherein in formula (4),
* is a bonding hand,

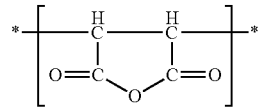
(5)

wherein in formula (5),
* is a bonding hand; and
(B) abrasive grains,
wherein a ratio of a number of moles of the repeating unit of formula (1) to a number of moles of the repeating unit of formula (3), (4), or (5), is from 1/20 to 20/1.

2. The chemical mechanical polishing aqueous dispersion according to claim 1, wherein the graft polymer (A) further comprises a repeating unit of formula (2):

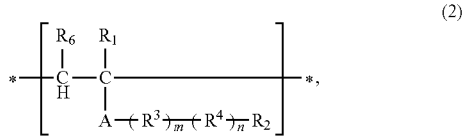

(2)

wherein
- $R^1$ is a hydrogen atom or a substituted or unsubstituted alkyl group having 1 to 6 carbon atoms,
- $R^2$ is a hydrogen atom or a substituted or unsubstituted alkyl group having 1 to 12 carbon atoms,
- A is a single bond, —O—, —COO—, an oxyalkylene group having 1 to 9 carbon atoms or —NH—, wherein the oxyalkylene group is $C_qH_{2q}O$, and q is an integer of from 1 to 9,
- $R^3$ and $R^4$ are each independently a structural unit selected from the group consisting of —$C_2H_4O$—, —$C_3H_6O$—, and —$C_4H_8O$—,
- m and n are each independently an integer of from 0 to 100, m+n>0,
- $R^6$ is a hydrogen atom or a carboxyl group, and
- * is a bonding hand.

3. The chemical mechanical polishing aqueous dispersion according to claim 1, wherein the graft polymer (A) has a weight average molecular weight of from 50,000 to 800,000.

4. The chemical mechanical polishing aqueous dispersion according to claim 1, wherein a content of the graft polymer (A) is from 0.001 to 1.0 mass %.

5. The chemical mechanical polishing aqueous dispersion according to claim 1, wherein the abrasive grains (B) are colloidal silica.

6. The chemical mechanical polishing aqueous dispersion according to claim 5, wherein a ratio, (A):(B), of a content of the graft polymer (A) to the content of the abrasive grains (B), is from 1:0.1 to 1:10,000.

7. A chemical mechanical polishing method comprising polishing a target surface comprising a low-dielectric-constant insulating film, with the chemical mechanical polishing aqueous dispersion according to claim 1.

8. The chemical mechanical polishing aqueous dispersion according to claim 2, wherein the graft polymer (A) has a weight average molecular weight of from 50,000 to 800,000.

9. A chemical mechanical polishing aqueous dispersion comprising:
(A) a graft polymer comprising a repeating unit of formula (1) and a repeating unit of formula (4):

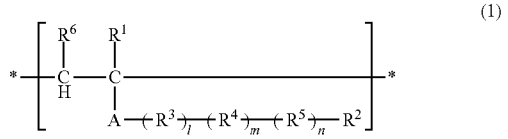

(1)

wherein in formula (1),
- $R^1$ is a hydrogen atom or a substituted or unsubstituted alkyl group having 1 to 6 carbon atoms,
- $R^2$ is a hydrogen atom or a substituted or unsubstituted alkyl group having 1 to 12 carbon atoms,
- A is a single bond, —O—, or an oxyalkylene group having 1 to 9 carbon atoms,
  wherein the oxyalkylene group is —$C_qH_{2q}O$— and q is an integer of from 1 to 9,
- $R^3$, $R^4$, and $R^5$ are each independently a structural unit selected from the group consisting of —$C_2H_4O$—, —$C_3H_6O$—, and —$C_4H_8O$—,
- l, m, and n are each independently an integer of from 0 to 100,
- l+n+m>0,
- $R^6$ is a hydrogen atom or a carboxyl group, and
- * is a bonding hand,

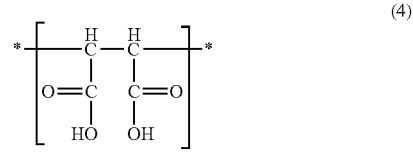

(4)

wherein in formula (4),
* is a bonding hand; and
(B) abrasive grains.

10. A chemical mechanical polishing aqueous dispersion comprising:
(A) a graft polymer comprising a repeating unit of formula (1) and a repeating unit of formula (5):

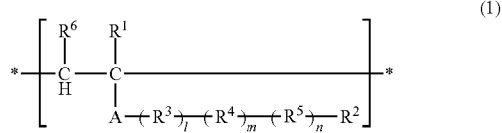

(1)

wherein in formula (1),
- $R^1$ is a hydrogen atom or a substituted or unsubstituted alkyl group having 1 to 6 carbon atoms,
- $R^2$ is a hydrogen atom or a substituted or unsubstituted alkyl group having 1 to 12 carbon atoms,
- A is a single bond, —O—, or an oxyalkylene group having 1 to 9 carbon atoms,
  wherein the oxyalkylene group is —$C_qH_{2q}O$— and q is an integer of from 1 to 9,
- $R^3$, $R^4$, and $R^5$ are each independently a structural unit selected from the group consisting of —$C_2H_4O$—, —$C_3H_6O$—, and —$C_4H_8O$—,
- l, m, and n are each independently an integer of from 0 to 100,
- l+n+m>0,
- $R^6$ is a hydrogen atom or a carboxyl group, and
- * is a bonding hand,

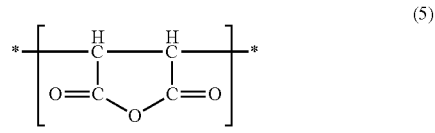

(5)

wherein in formula (5),
* is a bonding hand; and
(B) abrasive grains.

* * * * *